US009257199B2

(12) United States Patent
Schreiber

(10) Patent No.: US 9,257,199 B2
(45) Date of Patent: Feb. 9, 2016

(54) CANARY CIRCUIT WITH PASSGATE TRANSISTOR VARIATION

(71) Applicant: Advanced Micro Devices, Inc., Sunnyvale, CA (US)

(72) Inventor: Russell Schreiber, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 266 days.

(21) Appl. No.: 13/949,343

(22) Filed: Jul. 24, 2013

(65) Prior Publication Data

US 2015/0029799 A1    Jan. 29, 2015

(51) Int. Cl.
| | | |
|---|---|---|
| G11C 29/02 | (2006.01) | |
| G11C 8/08 | (2006.01) | |
| G11C 11/418 | (2006.01) | |
| G11C 29/12 | (2006.01) | |

(52) U.S. Cl.
CPC .............. *G11C 29/021* (2013.01); *G11C 8/08* (2013.01); *G11C 11/418* (2013.01); *G11C 29/025* (2013.01); *G11C 29/028* (2013.01); *G11C 2029/1202* (2013.01)

(58) Field of Classification Search
CPC ................................ G11C 5/147; G11C 5/145
USPC ..................................................... 365/189.09
See application file for complete search history.

(56) References Cited

U.S. PATENT DOCUMENTS

| | | | | |
|---|---|---|---|---|
| 5,568,437 | A * | 10/1996 | Jamal ............................ | 365/201 |
| 6,182,257 | B1 * | 1/2001 | Gillingham ................... | 714/733 |
| 6,628,540 | B2 * | 9/2003 | Marshall et al. .............. | 365/154 |
| 7,924,633 | B2 * | 4/2011 | Behrends et al. ........ | 365/189.11 |

* cited by examiner

*Primary Examiner* — Hoai V Ho
*Assistant Examiner* — Minh Dinh
(74) *Attorney, Agent, or Firm* — Volpe and Koenig, P.C.

(57) ABSTRACT

A canary circuit with passgate transistor variation is described herein. The canary circuit includes a memory canary circuit that has a plurality of bitcells. Each bitcell has at least a passgate transistor that is driven by a wordline voltage. The canary circuit further includes a regulator circuit that outputs a wordline voltage that accounts for a predetermined offset of a threshold voltage of the passgate transistor. In an embodiment, the regulator circuit is a subtractor circuit that generates the wordline voltage from a reference voltage based in part on the threshold voltage variation of the passgate transistor.

23 Claims, 4 Drawing Sheets

_US 9,257,199 B2_

CANARY CIRCUIT WITH PASSGATE TRANSISTOR VARIATION

TECHNICAL FIELD

The disclosed embodiments are generally directed to integrated circuits, and in particular, to memory.

BACKGROUND

Adaptive voltage and frequency scaling (AVFS) techniques compensate for process-voltage-temperature (PVT) and aging related variations in integrated circuits or chips. Canary circuits are used as part of the AVFS to monitor frequency and voltage headroom of various circuits and are designed to fail before the actual electronic device or circuit. Static random access memories (SRAMs) come in a variety of sizes and those having array sizes on the order of 2 MB, for example, present a particular challenge in monitoring in that the read/write speeds are largely dictated by large local variations as opposed to across the chip or global variations. The canary circuits for these large SRAMs do not take into account the large timing impact of bitcells that are degraded due to mostly local variations. The canary circuits may have some ability to track global variations but these global variations are generally minimal or in the noise as compared to the impact of the local variations.

SUMMARY OF EMBODIMENTS

A canary circuit with passgate transistor variation is described herein. The canary circuit includes a memory canary circuit that has a plurality of bitcells. Each bitcell has at least a passgate transistor that is driven by a wordline voltage. The canary circuit further includes a regulator circuit that outputs a wordline voltage that accounts for a predetermined offset from a threshold voltage of the passgate transistor. In an embodiment, the regulator circuit is a subtractor circuit that generates the wordline voltage from a reference voltage based in part on the threshold voltage variation of the passgate transistor.

BRIEF DESCRIPTION OF THE DRAWINGS

A more detailed understanding may be had from the following description, given by way of example in conjunction with the accompanying drawings wherein.

DETAILED DESCRIPTION

Figure 1:
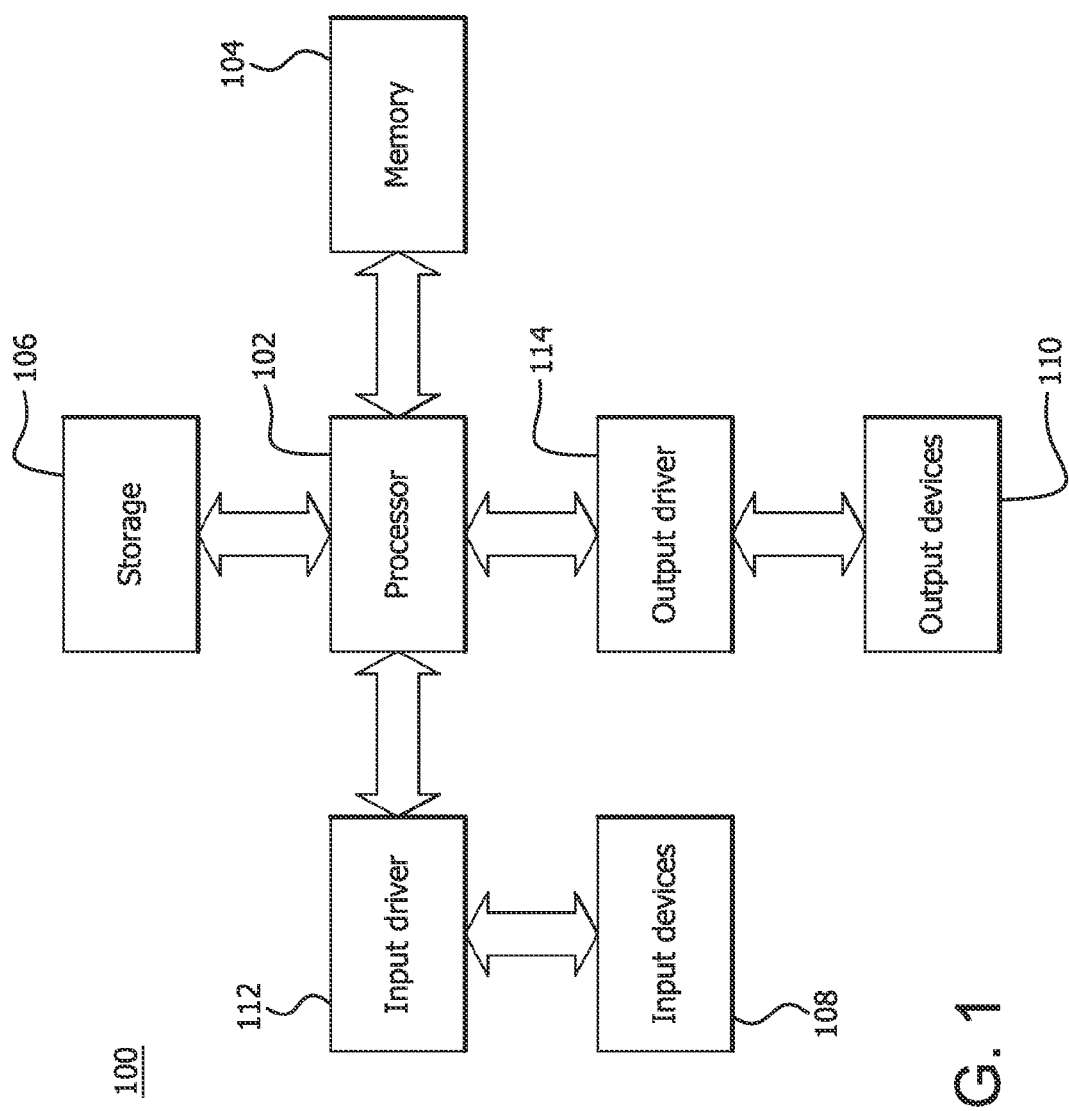
FIG. 1 is a block diagram of an example device in which one or more disclosed embodiments may be implemented.

FIG. 1 is a block diagram of an example device 100 in which one or more disclosed embodiments may be implemented. The device 100 may include, for example, a computer, a gaming device, a handheld device, a set-top box, a television, a mobile phone, or a tablet computer. The device 100 includes a processor 102, a memory 104, a storage device 106, one or more input devices 108, and one or more output devices 110. The device 100 may also optionally include an input driver 112 and an output driver 114. It is understood that the device 100 may include additional components not shown in FIG. 1.

The processor 102 may include a central processing unit (CPU), a graphics processing unit (GPU), a CPU and GPU located on the same die, or one or more processor cores, wherein each processor core may be a CPU or a GPU. The memory 104 may be located on the same die as the processor 102, or may be located separately from the processor 102. The memory 104 may include a volatile or non-volatile memory, for example, random access memory (RAM), static RAM (SRAM), dynamic RAM (DRAM), or a cache.

As noted above, embodiments of aspects of the invention will form part of a processor. In certain embodiments, such processors may provide certain desirable characteristics to a manufacturer of a device incorporating such a processor and/or desirable characteristics to an end user of these devices. For example, a device manufacturer may, in some instances, be provided a processor that accounts for the large timing impact of bitcells that are degraded due to mostly local variations. Additionally, in certain embodiments of aspects of the invention, an end user of a device including aspects of the invention may be provided an active feedback SRAM canary circuit that provides read/write speed tracking for large 2 MB SRAM arrays, for example.

The storage 106 may include a fixed or removable storage, for example, a hard disk drive, a solid state drive, an optical disk, or a flash drive. The input devices 108 may include a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 may include a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional components, and that the device 100 will operate in the same manner if the input driver 112 and the output driver 114 are not present.

In general, in accordance with some embodiments, a canary circuit is a number of columns of a regular SRAM with all the related controls that a SRAM might have. The canary circuits read and write functionally similar to regular SRAMs. The canary circuits consist of a small number of bit cells, (for example, this may be approximately 1 kilobyte to track 1 megabyte SRAMs), that are polled to determine if any failures are occurring given the current frequency and voltage margins. The canary circuit needs to fail before the regular circuit. In accordance with some embodiments, a canary circuit may be implemented for memory 104.

Figure 2:
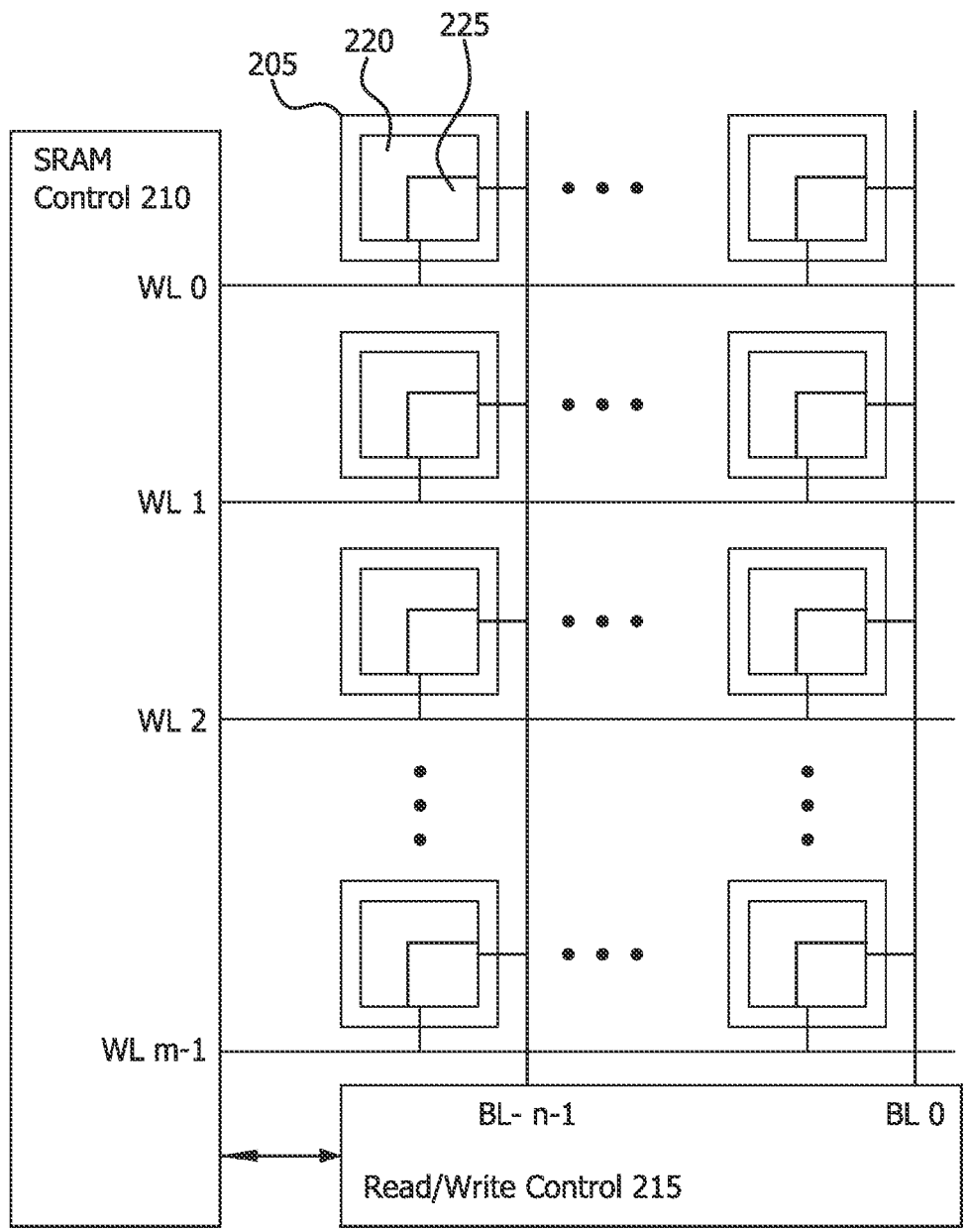
FIG. 2 is an example high level diagram of a static random access memory (SRAM)

FIG. 2 shows an example SRAM 200 having an m×n array of SRAM cells or bitcells 205, a SRAM control block 210 that controls or generates wordlines, (WL 0 . . . m−1), and a read/write control block 215 that controls or generates bitlines, (BL 0 . . . n−1). A typical bitcell 205 includes a storage cell or circuit 220 and a passgate transistor or access circuit 225 to control access to the storage cell 220 during read and write operations. The storage cell 220 and passgate transistor 225 are implemented from transistors, for example. Each of the passgate transistors 225 are connected to a corresponding wordline and bitline, (nominally a pair of bitlines is used to improve writeability and read speed). Access to the bitcell 205 is enabled by the particular wordline which controls the passgate transistor 225, (or passgate transistors when a pair of bitlines are used), which in turn controls whether the bitcell 205 should be connected to the bitlines. The passgate transistor 225 permits read and write operations when the wordline voltage at least meets the threshold voltage ($V_t$) of the passgate transistor 225. In practice, the wordline voltage should be closer to the positive voltage supply ($V_{DD}$) of the bitcell. The bitlines are used to transfer data for both read and write operations.

Canary circuits are used as part of Adaptive Voltage and Frequency Scaling (AVFS) techniques to monitor frequency and voltage headroom of various circuits, such as SRAMS, which in turn enables low operating margins and fails before an actual electronic device or circuit. Large SRAM arrays on the order of 2 MB, for example, may be used for L2 caches. However, these large SRAMs present issues in monitoring in that the read/write speeds are largely dictated by large local variations in $V_t$ of the transistors in addition to across the chip or global variations. In particular, the variations in the $V_t$ of the passgate transistor slow down or affect the SRAM speed. For example, if the $V_t$ for a bitcell has a standard deviation of $x\sigma$ from the mean $V_t$ then the passgate transistor will permit access to the bitcell only if the wordline voltage is $V_t+x\sigma$ and not just $V_t$; (as noted earlier the wordline in practice needs to be close to $V_{DD}$ of the bitcell). That is, an operation will not occur properly at desired speed, (the data is not written or read correctly). The canary circuits for these large SRAMs do not take into account the large timing impact of bitcells that are degraded due to mostly local variations.

Although the canary circuits may have some ability to track global variations, these global variations are generally minimal or may be absorbed by the noise as compared tracking the impact of the local variations. For example, some of the problems may be overcome by very large bit count canary circuits, (which are not power/area efficient), or by performing excessive post Si characterization to determine the offset between the canary circuit, (global variations only), and the actual circuit, (global plus local variations). Other techniques use percentage based wordline underdrive solutions that can degrade the drive of the wordline by a percentage of the positive voltage supply ($V_{DD}$). These techniques are unsuitable since the $V_t$ offset is a fixed number, and the amount of wordline underdrive is generally a percentage of the total voltage. Although this allows for some level of wordline underdrive tunability, the technique is applicable to only one voltage rather than across process-voltage-temperature (PVT) variations. That is, any percentage based approach would be correct at the selected voltage but not correct for any other voltage.

As stated above, the dominate source of variation for large SRAM arrays are local variations in the $V_t$ of the transistors and in particular, the passgate transistors. To address the local variations, an embodiment of a canary circuit needs to account for a standard deviation of approximately $x\sigma$ of the speed distribution of the large SRAM cell to predict the speed of the large SRAM array. This is based on the fact that large SRAM arrays, (those on the order of 2 MB), consist of a large number of bitcells, (16 billion bitcells for a 2 MB array), and that at least one bitcell is going to have a x standard deviation from the mean due to statistical distribution. For example, the standard deviation may be 5 $\sigma$, which provides for a large variation away from the mean value. By underdriving the passgate transistor of a nominal bit cell by the x standard deviation, read/write speeds will be obtained that are representative of an $X\sigma$ bitcell.

Figure 3:
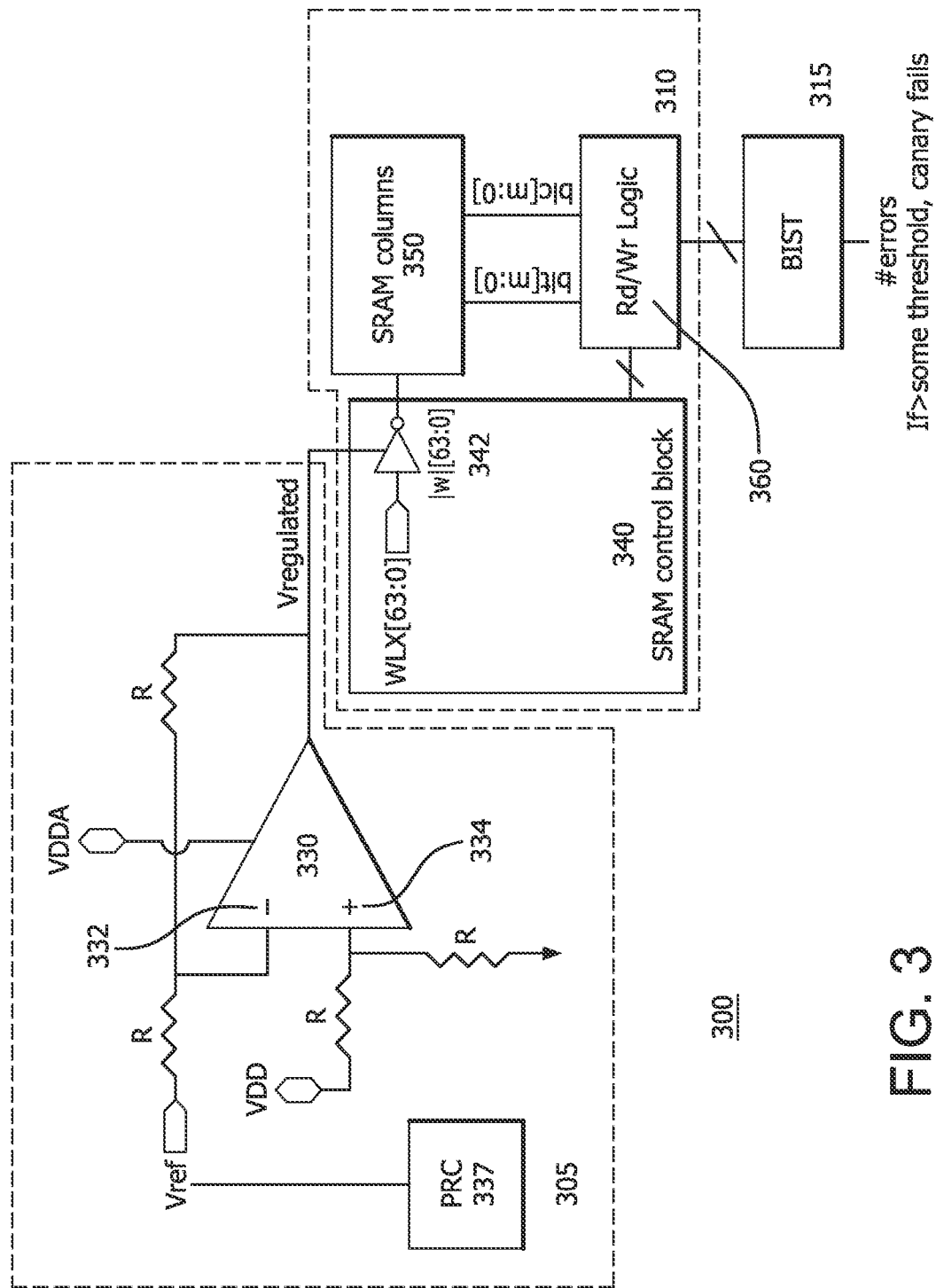
FIG. 3 is an example canary circuit in accordance with some embodiments.

In accordance with some embodiments, FIG. 3 is an example of a canary circuit 300 that approximates a 5 standard deviation bitcell. The 5 standard deviation is illustrative and those of ordinary skill can use other values in accordance with other embodiments. Canary circuit 300 includes a regulator circuit 305 connected to a SRAM canary circuit 310, which in turn may be connected to a built-in self test (BIST) circuit 315. The regulator circuit 305 includes an operational amplifier 330 that is implemented as a subtractor circuit. In particular, a negative terminal 332 is tied to a reference voltage ($V_{ref}$) via a resistor R and a positive terminal 334 is tied to a resistor R which is tied to ground and to $V_{DD}$ via a resistor R. The operational amplifier 330 may further be supplied by an analog power supply $V_{DDA}$, which provides a more constant power supply and ensures that the components in the operational amplifier 330 stay properly biased.

The SRAM canary circuit 310 includes a SRAM control block 340 connected to SRAM columns (or array) 350 via a wordline (WLX) and to a read/write logic block 360, which in turn is connected to the SRAM columns (or array) 350 via a pair of bitlines, bitline true (blt) and bitline complementary (blc). The SRAM control block 340 further includes wordline drivers 342. The wordline drivers 342 may be, for example, an inverter. The SRAM control block 340 provides the control signals for enabling read/write operations. The BIST circuit 315 may be connected to the read/write logic block 360.

In the above configuration where all the resistors have the same value in the regulator circuit 305, the regulator circuit 305 outputs a regulated voltage ($V_{reg}$) which is equal to $V_{DD}$-$V_{ref}$, which in turn is the power supply to the wordline drivers 342 of the SRAM control block 340. The $V_{ref}$ value is tuned by a programmable reference circuit (PRC) 337 to be close to the standard deviation of $x\sigma$ of the $V_t$ of the bitcell's passgate transistor. The PRC 337 may be, for example, a programmable resistor ladder. As stated above, the wordline voltage is what appears at the passgate transistor in the SRAM columns 350. By underdriving the passgate transistor by the standard deviation of x, read/write speeds will be obtained that are representative of a $x\sigma$ bitcell. The $V_{ref}$ value may be determined via post silicon calibration, hspice modeling and/or a combination thereof. The $V_{ref}$ determination accounts for the standard deviation from the $V_t$ value.

In general, BIST circuits are necessary to determine if all the read and writes are happening as planned. A BIST circuit may have to be altered to ignore a set number of bad read/write values per access. For example, the BIST circuit 315 may be needed because the SRAM columns 350 may have some poorly matched bitcells, i.e. bitcells that have already have a $V_t$ variation. For example, if a bitcell in the SRAM columns 350 is already an 3 $\sigma$ bitcell and an additional 5 $\sigma$ worth of $V_t$ is substracted off, then the canary circuit 300 will fail well before the regular SRAM. The BIST circuit 315 mitigates the possibility of having the same high variability bits in the canary circuit 300. This may be implemented by setting a threshold where a predetermined number of errors are ignored when a predetermined number of bits are read. However, if the number of errors is greater than the threshold, then it may be an indication that the voltage is not high enough or that the operating speed is too high. The threshold value may be determined via post silicon calibration.

Operationally, the BIST circuit 315 triggers the read/write logic block 360 to do a series of reads and writes and confirms the success or failure of the read and writes. Failure may occur when the wrong data is read from the array or when the data is not successfully written into the array. If the BIST circuit 315 determines that a certain number of the bit cells in the SRAM columns 350 is not working correctly, then the BIST circuit 315 reports that the voltage needs to be increased or frequency needs to be decreased to avoid SRAM failure. This provides a method for obtaining the lowest margin of operation, in real-time with active feedback, on a component-by-component basis, where margin reflects the level of wasted power. Once the margin is determined, then the process may be repeated by decreasing the voltage or increasing the frequency until the canary circuit indicates that failure in imminent.

Figure 4:
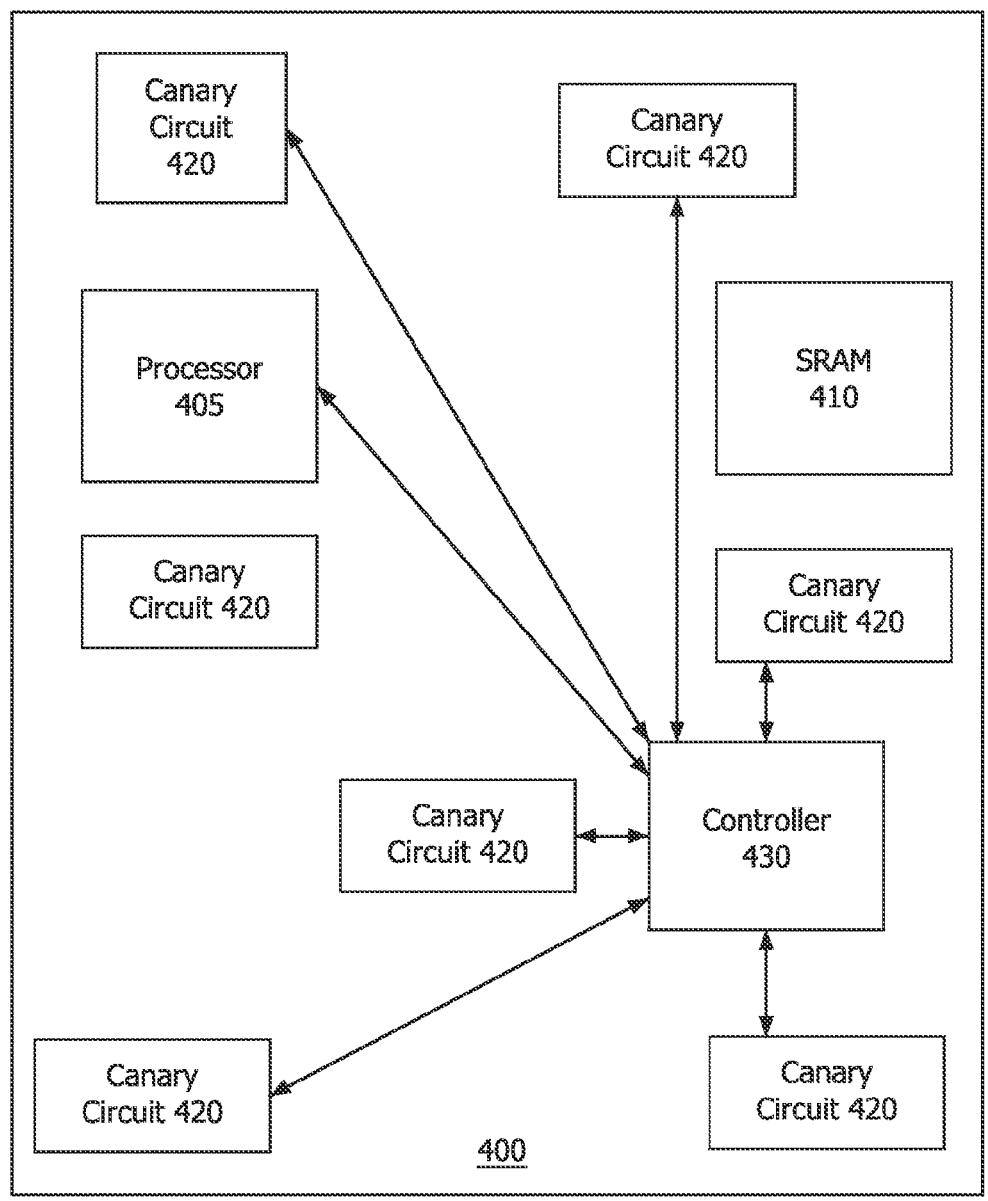
FIG. 4 is an example integrated circuit in accordance with some embodiments.

FIG. 4 is an embodiment of an integrated circuit 400 that may be included in, for example, a computer, a gaming device, a handheld device, a set-top box, a television, a mobile phone, or a tablet computer. The integrated circuit 400 includes at least a processor 405, a SRAM 410, and may include additional components not shown in FIG. 4. In accordance with some embodiments, SRAM 410 may be, for example, the SRAM 200 of FIG. 2. The integrated circuit 400 further includes a plurality of canary circuits 420 that are tied to a controller 430. The plurality of canary circuits 420 are distributed across the integrated circuit 400 to account for at least temperature gradients and chip variations. This provides a cross section of the integrated circuit 400. The controller 430 polls the plurality of canary circuits 420 on a predetermined schedule or on demand to check on operating margin. In particular, the controller 430 signals the BIST, (as shown in FIG. 3), to run an actual test. The tests determine the amount of margin available based on the actual temperature and the current frequency and voltage. The results from the tests are then used to set the frequency and voltage to change the margin, if appropriate. For example, if the margin is too low, the actual SRAM may fail. In his case, the frequency would need to be decreased or the voltage would need to be increased.

In general, in accordance with some embodiments, a canary circuit comprises a memory canary circuit including a plurality of bitcells, where each bitcell has at least one passgate transistor. The canary circuit further includes a regulator circuit which outputs a wordline voltage that accounts for a predetermined offset from a threshold voltage of the passgate transistor, where the passgate transistor is driven by the wordline voltage. In some embodiments, the regulator circuit includes a subtractor circuit generates the wordline voltage from a reference voltage based in part on a threshold voltage variation of the passgate transistor. In some embodiments, the regulator circuit includes an operational amplifier circuit tied to a positive voltage supply and a reference voltage based in part on a threshold voltage variation of the passgate transistor. The operational amplifier circuit generates the wordline voltage from the reference voltage and the power supply voltage. In some embodiments, the threshold voltage is a mean threshold voltage.

In some embodiments, the canary circuit includes a test circuit that runs read/write tests on the canary circuit. The test circuit determines canary circuit failure on a condition that a number of errors exceed a predetermined threshold. In some embodiments, the test circuit ignores a predetermined number of errors.

In some embodiments, an integrated circuit includes a plurality of canary circuits distributed across the integrated circuit. Each canary circuit has a passgate transistor and accounts for a predetermined offset from a threshold voltage of the passgate transistor. A controller is connected to each canary circuit. The controller polls the plurality of canary circuits to determine an operating margin. In some embodiments, each canary circuit includes a memory canary circuit with a passgate transistor and a regulator circuit that outputs a wordline voltage that accounts for the predetermined offset from the threshold voltage of the passgate transistor. The passgate transistor is driven by the wordline voltage.

In some embodiments, the regulator circuit includes a subtractor circuit which generates the wordline voltage from a reference voltage based in part on a threshold voltage variation of the passgate transistor. In some embodiments, the regulator circuit includes an operational amplifier circuit tied to a reference voltage based in part on the threshold voltage variation of the passgate transistor and a power supply voltage. The operational amplifier circuit generates the wordline voltage from the reference voltage and the power supply voltage. In some embodiments, the reference voltage is tuned by a programmable reference circuit.

In some embodiments, each canary circuit further includes a test circuit connected to the controller. The test circuit runs read/write tests on the canary circuit on request from the controller. The test circuit determines canary circuit failure on a condition that a number of errors exceed a predetermined threshold. The controller alters the operating frequency and voltage based on results from each test circuit. The test circuit ignores a predetermined number of errors. In some embodiments, the controller polls the plurality of canary circuits on at least one of a scheduled basis or on demand.

In some embodiments, a method for handling passgate transistor variation includes connecting a regulator circuit to a canary circuit which includes a plurality of bitcells. Each bitcell having a passgate transistor. The method further includes generating, at the regular circuit, a wordline voltage that accounts for a predetermined offset from a threshold voltage of the passgate transistor and driving the passgate transistor with the wordline voltage. A reference voltage is provided to a subtractor circuit. The reference voltage being based in part on a threshold voltage variation of the passgate transistor. The reference voltage is subtracted from a positive voltage supply to generate the wordline voltage.

In some embodiments, the reference voltage is tied to one terminal of an operational amplifier. The reference voltage is based in part on a threshold voltage variation of the passgate transistor. A positive voltage supply is tied to another terminal of the operational amplifier. A wordline voltage is determined from the reference voltage and the positive voltage supply.

It should be understood that many variations are possible based on the disclosure herein. Although features and elements are described above in particular combinations, each feature or element may be used alone without the other features and elements or in various combinations with or without other features and elements.

The methods provided may be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors may be manufactured by configuring a manufacturing process using the results of processed hardware description language (HDL) instructions and other intermediary data including netlists (such instructions capable of being stored on a computer readable media). The results of such processing may be maskworks that are then used in a semiconductor manufacturing process to manufacture a processor which implements aspects of the disclosed embodiments.

The methods or flow charts provided herein may be implemented in a computer program, software, or firmware incorporated in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. An apparatus, comprising:
a memory canary circuit including a plurality of bitcells, each bitcell having at least one passgate transistor;
a regulator circuit configured to output a wordline voltage that accounts for a predetermined offset from a threshold voltage of the passgate transistor, wherein the passgate transistor is driven by the wordline voltage; and
a test circuit configured to determine memory canary circuit failure on a condition that a number of read/write errors on the memory canary circuit exceed a predetermined threshold, wherein an operating frequency and voltage are altered based on the memory canary circuit failure determination.

2. The apparatus of claim 1, wherein the regulator circuit comprises:
a subtractor circuit configured to generate the wordline voltage from a reference voltage based in part on a threshold voltage variation of the passgate transistor.

3. The apparatus of claim 1, wherein the regulator circuit comprises:
an operational amplifier circuit tied to a positive voltage supply and a reference voltage based in part on a threshold voltage variation of the passgate transistor, the operational amplifier circuit configured to generate the wordline voltage from the reference voltage and the power supply voltage.

4. The apparatus of claim 1,
wherein the test circuit is configured to run read/write tests on the memory canary circuit.

5. The apparatus of claim 4, wherein the test circuit is configured to ignore a predetermined number of errors.

6. The apparatus of claim 1, wherein the threshold voltage is a mean threshold voltage.

7. An integrated circuit, comprising:
a plurality of canary circuits distributed across the integrated circuit, wherein each canary circuit has a passgate transistor and is configured to account for a predetermined offset from a threshold voltage of the passgate transistor;
a controller connected to each canary circuit, wherein the controller is configured to poll the plurality of canary circuits to determine an operating margin;
a test circuit associated with each canary circuit, the test circuit configured to determine canary circuit failure on a condition that a number of read/write errors exceed a predetermined threshold; and
the controller further configured to alter an operating frequency and voltage based on the canary circuit failure determination from each test circuit.

8. The integrated circuit of claim 7, wherein each canary circuit comprises:
a memory canary circuit including the passgate transistor; and
a regulator circuit configured to output a wordline voltage that accounts for the predetermined offset from the threshold voltage of the passgate transistor, wherein the passgate transistor is driven by the wordline voltage.

9. The integrated circuit of claim 8, wherein the regulator circuit comprises:
a subtractor circuit configured to generate the wordline voltage from a reference voltage based in part on a threshold voltage variation of the passgate transistor.

10. The integrated circuit of claim 8, wherein the regulator circuit comprises:
an operational amplifier circuit tied to a reference voltage based in part on the threshold voltage variation of the passgate transistor and a power supply voltage, the operational amplifier circuit configured to generate the wordline voltage from the reference voltage and the power supply voltage.

11. The integrated circuit of claim 8, wherein the reference voltage is tuned by a programmable reference circuit.

12. The integrated circuit of claim 8, wherein
the test circuit is connected to the controller; and
the test circuit is configured to run read/write tests on the canary circuit on request from the controller.

13. The integrated circuit of claim 12, wherein the test circuit is configured to ignore a predetermined number of errors.

14. The integrated circuit of claim 7, wherein the controller polls the plurality of canary circuits on at least one of a scheduled basis or on demand.

15. A method for handling passgate transistor variation, comprising:
connecting a regulator circuit to a canary circuit which includes a plurality of bitcells, each bitcell having a passgate transistor;
generating, at the regulator circuit, a wordline voltage that accounts for a predetermined offset from a threshold voltage of the passgate transistor;
driving the passgate transistor with the wordline voltage;
determining canary circuit failure on a condition that a number of read/write errors exceed a predetermined threshold; and
altering an operating frequency and voltage based on the canary circuit failure determination.

16. The method of claim 15, further comprising:
providing a reference voltage to a subtractor circuit, wherein the reference voltage is based in part on a threshold voltage variation of the passgate transistor; and
subtracting the reference voltage from a positive voltage supply to generate the wordline voltage.

17. The method of claim 15, further comprising:
tying a reference voltage to one terminal of an operational amplifier, wherein the reference voltage is based in part on a threshold voltage variation of the passgate transistor;
tying a positive voltage supply to another terminal of the operational amplifier; and
determining the wordline voltage from the reference voltage and the positive voltage supply.

18. The method of claim 15, further comprising:
running read/write tests via a test circuit.

19. The method of claim 18, wherein a predetermined number of errors are ignored by the test circuit.

20. The method of claim 15, wherein the passgate transistor is a plurality of passgate transistors.

21. A computer-readable storage medium configured to store a set of instructions used for manufacturing a device, wherein the device comprises:
- a memory canary circuit including a plurality of bitcells, each bitcell having at least one passgate transistor;
- a regulator circuit configured to output a wordline voltage that accounts for a predetermined offset from a threshold voltage of the passgate transistor, wherein the passgate transistor is driven by the wordline voltage; and
- a test circuit configured to determine memory canary circuit failure on a condition that a number of read/write errors on the memory canary circuit exceed a predetermined threshold, wherein an operating frequency and voltage are altered based on the memory canary circuit failure determination.

22. The computer-readable storage medium of claim 21, wherein the instructions are Verilog data instructions.

23. The computer-readable storage medium of claim 21, wherein the instructions are hardware description language (HDL) instructions.

* * * * *